(12) United States Patent
Shin

(10) Patent No.: US 7,656,194 B2
(45) Date of Patent: Feb. 2, 2010

(54) SHIFT REGISTER CIRCUIT

(75) Inventor: Dong Yong Shin, Seoul (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 705 days.

(21) Appl. No.: 11/505,374

(22) Filed: Aug. 17, 2006

(65) Prior Publication Data

US 2007/0103404 A1    May 10, 2007

(30) Foreign Application Priority Data

Nov. 4, 2005    (KR) ............... 10-2005-0105697

(51) Int. Cl.
    *H03K 19/173*    (2006.01)
(52) U.S. Cl. ................. 326/46; 377/64; 345/100
(58) Field of Classification Search ............ 326/37, 326/38, 46; 345/98–100; 377/57–64, 154
    See application file for complete search history.

(56) References Cited

U.S. PATENT DOCUMENTS

| 6,426,743 B1 | 7/2002 | Yeo et al. |
| 2002/0149318 A1 | 10/2002 | Jeon et al. |
| 2003/0128180 A1 | 7/2003 | Kim et al. |
| 2007/0040771 A1* | 2/2007 | Chung et al. ............... 345/76 |
| 2007/0263763 A1* | 11/2007 | Moon ....................... 377/68 |
| 2008/0012818 A1* | 1/2008 | Lee et al. .................. 345/100 |
| 2008/0226013 A1* | 9/2008 | Deane ....................... 377/70 |

FOREIGN PATENT DOCUMENTS

| KR | 2000-55633 | 8/2000 |
| KR | 10-438525 | 6/2004 |

OTHER PUBLICATIONS

Search Report issued in European Patent Application No. 06255686.5 on Jul. 9, 2007.

\* cited by examiner

*Primary Examiner*—Don P Le
(74) *Attorney, Agent, or Firm*—Stein McEwen, LLP

(57) ABSTRACT

A shift register circuit comprising a plurality of stages dependently connected to an initial input signal or an output signal of a previous stage and connected to first and second clock signals which are mutually inverted. Each stage includes eight switching devices interconnected together with three capacitors and interfaced through eleven interface points. Some of the interface points are connected to the first and second clock signals according to whether the stage is an even numbered stage or an odd numbered stage. Other ones of the interface points are connectable to the first and second clock signals in alternative ways to reduce power consumption without changing an internal configuration of the stage.

21 Claims, 4 Drawing Sheets

FIG. 3A CLK1

FIG. 3B CLK2

| Interface Terminal | Function | | | | | |
|---|---|---|---|---|---|---|
| | FIG. 2 | | FIG. 4A | | FIG. 4B | |
| | Odd Stage | Even Stage | Odd Stage | Even Stage | Odd Stage | Even Stage |
| first | VDD | VDD | VDD | VDD | VDD | VDD |
| second | OUT | OUT | OUT | OUT | OUT | OUT |
| third | VSS | VSS | VSS | VSS | VSS | VSS |
| fourth | VSS | VSS | VSS | VSS | CLK1 | CLK2 |
| fifth | CLK1 | CLK2 | CLK1 | CLK2 | CLK1 | CLK2 |
| sixth | CLK2 | CLK1 | CLK2 | CLK1 | CLK2 | CLK1 |
| seventh | CLK2 | CLK1 | CLK2 | CLK1 | CLK2 | CLK1 |
| eighth | IN1 | IN2 | IN1 | IN2 | IN1 | IN2 |
| ninth | VDD | VDD | CLK2 | CLK1 | VDD | VDD |
| tenth | IN1 | IN2 | IN1 | IN2 | IN1 | IN2 |
| eleventh | CLK1 | CLK2 | CLK1 | CLK2 | CLK1 | CLK2 |

SHIFT REGISTER CIRCUIT

CROSS-REFERENCE TO RELATED APPLICATIONS

This application claims the benefit of Korean Patent Application No. 2005-105697, filed on Nov. 4, 2005, in the Korean Intellectual Property Office, the disclosure of which is incorporated herein by reference.

BACKGROUND OF THE INVENTION

1. Field of the Invention

Aspects of the present invention relate to a shift register circuit, and more particularly, to a shift register circuit provided in an organic electroluminescent display and sequentially outputting signals different in polarity.

2. Description of the Related Art

In general, an active matrix display such as an organic electroluminescent display is provided with a pixel array matrix in a region where data lines and scan lines intersect with each other.

Here, the scan lines form horizontal lines (row lines) of a matrix pixel portion, through which predetermined signals are sequentially supplied by a shift register circuit provided in a scan driver.

Such a shift register is widely classified into a dynamic shift register and a static shift register. The dynamic shift register needs a relatively small number of thin film transistors (TFT) per stage and has a simple structure, but the dynamic shift register has shortcomings that a frequency band for a clock is narrow and power consumption is relatively high.

On the other hand, the static shift register needs a relatively large number of TFTs per stage, but it has advantages that the frequency band for the clock is wide and power consumption is relatively low.

For a shift register to be mounted in the active matrix display such as the organic electroluminescent display, it is important to decrease the number of TFTs as long as functions of the shift register are not deteriorated. However, it is more important to secure high reliability and low power consumption in the circuit operation.

Further, as the organic light emitting display has recently become larger having a large-sized panel, the scan driver to be mounted in the panel should include the shift register, thereby reducing the size, the weight and the production cost of the organic light emitting display. However, the conventional shift register includes a p-type metal oxide semiconductor (PMOS) transistor and an n-type metal oxide semiconductor (NMOS) transistor, so that it is difficult to mount it on the panel. Further, the conventional shift register including the PMOS transistor and the NMOS transistor consumes much power because a predetermined static current flows through the transistor while generating an output signal.

SUMMARY OF THE INVENTION

Accordingly, an aspect of the present invention is to provide a 2-phase shift register circuit including a plurality of PMOS transistors and capacitors, in which a yield is enhanced, a production coat is reduced, and power consumption is lowered.

According to an exemplary embodiment of the present invention, a shift register circuit includes n stages SRU1 through SRUn. Each stage is dependently connected to an initial input signal IN or an output signal of a previous stage and connected to first and second clock signals CLK1 and CLK2, each stage including: a first switching device SW1 connected between a first power source VDD and an output terminal N2; a second switching device SW2 connected between the output terminal N2 and a second power source VSS; a third switching device SW3 connected between a first node N1 and the output terminal N2 and having a gate electrode connected to the gate electrode of the first switching device SW1; a fourth switching device SW4 connected between the first node N1 and the second power source VSS and having a gate electrode connected to an output terminal of a conversion part; a fifth switching device SW5 connected between a first input terminal and the gate electrode of the first switching device SW1; a first capacitor C1 connected between the output terminal N2 and the first node N1; and a second capacitor C2 connected between the first power source VDD and the gate electrode of the first switching device SW1.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIGS. 3A-3G are timing diagrams showing input/output signal waveforms of the shift register circuit shown in FIG. 1;

FIG. 5 is a table comparatively showing the various interconnections of the stage circuits shown in FIGS. 2, 4A and 4B.

DETAILED DESCRIPTION OF THE EMBODIMENTS

Figure 1:
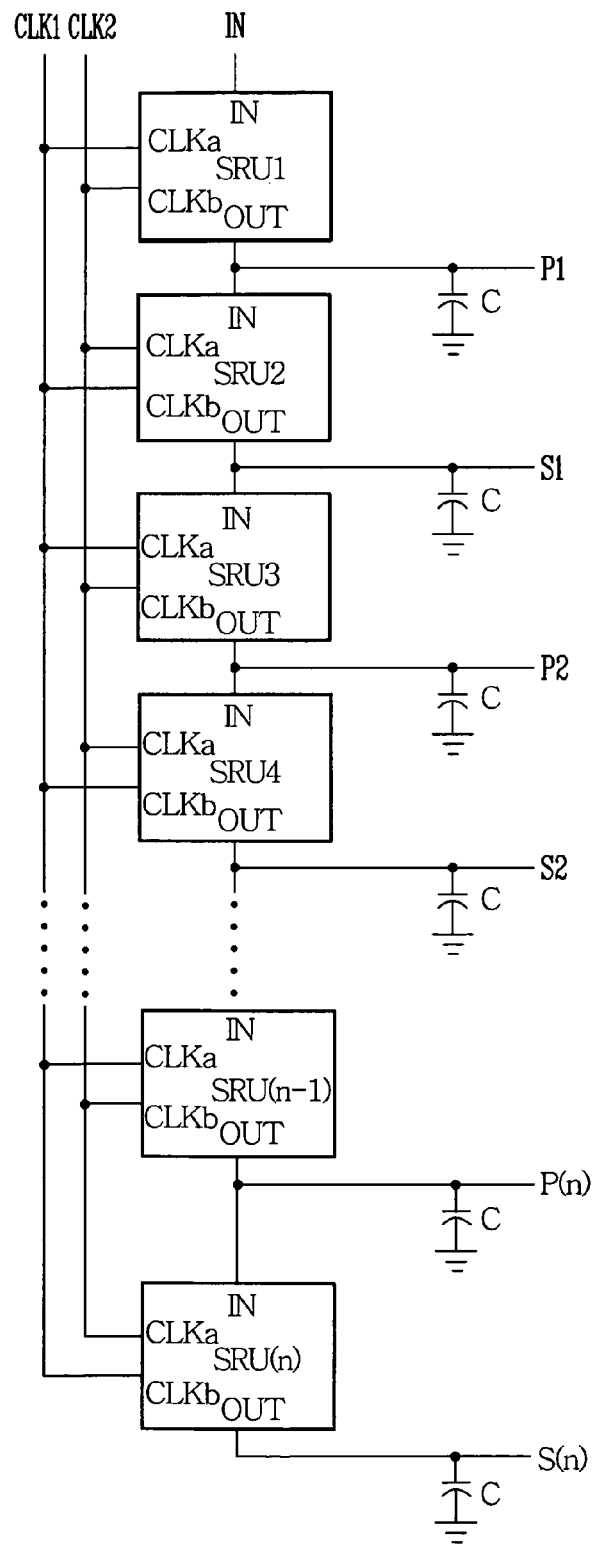
FIG. 1 is a block diagram of a shift register circuit according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

FIG. 1 is a block diagram of a shift register circuit according to an embodiment of the present invention.

As shown in FIG. 1, the shift register circuit includes a plurality of stages (shift register units) SRU1 through SRU(n). The $1^{st}$ stage SRU1 receives an initial input signal IN, and the output signals of the $1^{st}$ through $(n-1)^{th}$ stages are supplied as input signals to the following stages thereof, respectively.

Further, each stage SRU1 through SRU(n) includes a first clock terminal CLKa and a second clock terminal CLKb which receive first and second clock signals CLK1 and CLK2 having phases inverted from each other. In the odd numbered stages, the first clock terminals CLKa receive the first clock signal CLK1, and the second clock terminals CLKb receive the second clock signal2. On the other hand, in the even numbered stages, the first clock terminals CLKa receive the second clock signal CLK2, and the second clock terminals CLKb receive the first clock signal CLK1.

That is, the stages, which receive the initial input signal IN or the output voltages from the previous terminals and the first and second clock signals CLK1 and CLK2, output predetermined signals through the respective output lines thereof in sequence.

The shift register circuit according to the embodiment of the present invention employs the odd numbered stages to sequentially shift the signals having an inverted level with respect to the initial input signal, i.e., having an inverted polarity, and outputs the shifted signals P1, P2, . . . P(n−1), Pn; and employs the even numbered stages to sequentially shift the signals having the same phase with the initial input signal and outputs the shifted signals S1, S2, . . . S(n−1), Sn.

Thus, the shift register circuit can either select the signals P1, P2, . . . P(n−1), Pn sequentially output from the odd numbered stages or the signals S1, S2, . . . S(n−1), Sn sequentially output from the even numbered stages.

For example, when the shift register circuit is in general use, the signals S1, S2, . . . S(n−1), Sn output from the even numbered stages are selected.

A predetermined capacitor C is, as shown in FIG. 1, may be provided in an output line of each stage SRU1 through SRU (n).

Figure 2:
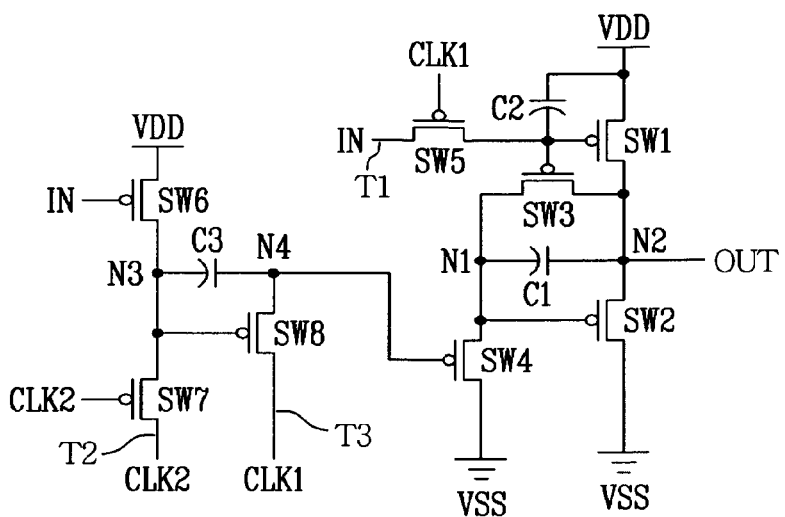
FIG. 2 is a circuit diagram of a stage (SRU) of the shift register circuit of FIG. 1 according to a first embodiment of the present invention.

FIG. 2 is a circuit diagram of a stage (SRU) of the shift register circuit of FIG. 1 according to a first embodiment of the present invention, and FIGS. 3A-3G are timing diagrams showing input/output signal waveforms of the shift register circuit shown in FIG. 1.

FIG. 2 is a circuit diagram showing the $1^{st}$ stage SRU1 of the shift register circuit shown in FIG. 1. Here, the first and second clock signals CLK1, CLK2, respectively, and the initial input signal IN are input to the $1^{st}$ stage SRU1 of the shift register circuit. The CLK1 and CLK2 references shown in FIG. 2 represent inputs to CLKa and CLKb, respectively, as shown in FIG. 1.

Referring to FIG. 2, the stage SRU1 of the shift register circuit shown in FIG. 1 includes a first switching device SW1 connected between a first power source VDD and an output terminal N2; a second switching device SW2 connected between the output terminal (OUT) N2 and a second power source VSS; a third switching device SW3 connected between a first node N1 and the output terminal N2 and having a gate electrode connected to a gate electrode of the first switching device SW1; a fourth switching device SW4 connected between the first node N1 and the second power source VSS and having a gate electrode connected to an output terminal N4 of a conversion part; a fifth switching device SW5 connected between a first input terminal T1 and the gate electrode of the first switching device SW1; a first capacitor C1 connected between the output terminal N2 and the first node N1; and a second capacitor C2 connected between the first power source VDD and the gate electrode of the first switching device SW1.

Here, the first power source VDD has a voltage level higher than that of the second power source VSS. Further, the first through fifth switching devices SW1 through SW5 may be implemented by PMOS transistors.

The fifth switching device SW5 has a first electrode connected to the first input terminal T1 to receive the initial input signal IN and the gate electrode to receive the first clock signal CLK1.

Further, the fourth switching device SW4 has a first electrode connected to the first node N1, a second electrode connected to the second power source VSS, and the gate electrode connected to an output terminal N4 of the conversion part.

The conversion part includes a sixth switching device SW6 connected between the first power source VDD and a third node N3; a seventh switching device SW7 connected between the third node N3 and a second input terminal T2; an eighth switching device SW8 connected between the output terminal N4 of the conversion part and a third input terminal T3 and having a gate electrode connected to the third node N3; and a third capacitor C3 connected between the third node N3 and the output terminal N4 of the conversion part.

Like the first input terminal T1, the gate electrode of the sixth switching device SW6 receives the initial input signal IN.

Further, a gate electrode of the seventh switching device SW7 receives the second clock signal CLK2; the second input terminal T2 receives the second clock signal CLK2; and the third input terminal T3 receives the first clock signal CLK1.

That is, the fourth switching device SW4 is turned on/off by an output signal from terminal N4 of the conversion part.

Further, the first capacitor C1 connected between the output terminal N2 and the first node N1 is also connected between the first electrode and the gate electrode of the second switching device SW2. Here, the first capacitor C1 is charged with a voltage corresponding to whether the second switching device SW2 is turned on or off.

For example, when the second switching device SW2 is turned on, the first capacitor C1 stores a voltage to turn on the second switching device SW2. On the other hand, when the second switching device SW2 is turned off. The first capacitor C1 stores a voltage to turn off the second switching device SW2.

Likewise, the second capacitor C2 connected between the first power source VDD and the gate electrode of the first switching device SW1 is also connected between the first electrode and the gate electrode of the first switching device SW1. Here, the second capacitor C2 is charged with a voltage corresponding to whether the first switching device SW1 is turned on or off.

For example, when the first switching device SW1 is turned on, the second capacitor C2 stores a voltage to turn on the first switching device SW1. On the other hand, when the first switching device SW1 is turned off, the second capacitor C2 stores a voltage to turn off the first switching device SW1.

Further, the third capacitor C3 connected between the third node N3 and the output terminal N4 of the conversion part is also connected between the first electrode and the gate electrode of the eighth switching device SW8. Here, the third capacitor C3 is charged with a voltage corresponding to whether the eighth switching device SW8 is turned on or off.

For example, when the eighth switching device SW8 is turned on, the third capacitor C3 stores a voltage to turn on the eighth switching device SW8. On the other hand, when the eighth switching device SW8 is turned off, the third capacitor C3 stores a voltage to turn off the eighth switching device SW8.

Referring to FIGS. 2 and 3, the $1^{st}$ stage SRU1 of the shift register circuit operates as follows.

In a first period T1, the first clock signal CLK1 has a low level; the second clock signal CLK2 has a high level; and the initial input signal has a high level.

In this case, the sixth and seventh switching devices SW6 and SW7 are turned off, and the eighth switching device SW8 is turned on by a voltage previously stored in the capacitor C3, thereby turning on the fourth switching device SW4 having the gate electrode connected to the output terminal N4 of the conversion part.

Then, the fifth switching device SW5 is turned on by the first clock signal CLK1, and thus the input signal IN having the high level is input to the gate electrode of the first switching device SW1, thereby turning off the first switching device SW1.

Therefore, the second capacitor C2 is charged with a voltage to turn on the first switching device SW1 during the first period T1, i.e., a voltage corresponding to turning-off the first switching device SW1.

Because the input signal IN has the high level, the third switching device SW3 is also turned off. Further, the fourth switching device SW4 turned on as described above allows the second power source VSS to apply a voltage to the gate electrode of the second switching device SW2. Then, the output corresponds to the second power source VSS connected to the second electrode of the second switching device SW2, i.e., has the low level.

Thus, the first capacitor C1 is charged with a voltage to turn on the second switching device SW2 during the first period T1, i.e., a voltage corresponding to turning on the second switching device SW2.

In a second period T2, the first clock signal CLK1 has a high level; the second clock signal CLK2 has a low level; and the initial input signal has a low level.

In this case, the sixth and seventh switching devices SW6 and SW7 are turned on, and the eighth switching device SW8 is also turned on as the second clock signal having the low level is applied to the gate electrode of the eighth switching unit SW8 by the turned on seventh switching device SW7.

Then, the capacitor C3 is charged with a voltage to turn on the eighth switching device SW8 during the second period T2, i.e., a voltage corresponding to turning-on the eighth switching device SW8.

When the eighth switching device SW8 is turned on, the first clock signal CLK1 having the high level is output through the output terminal N4 of the conversion part, thereby turning off the fourth switching device SW4 having the gate electrode connected to the output terminal of the conversion part.

Further, the fifth switching device SW5 is turned off by the first clock signal CLK1, and thus the first and third switching devices SW1 and SW3 are turned off by the voltage previously stored in the second capacitor C2.

As the fourth switching transistor SW4 is turned off, the second switching device SW2 is turned on by the voltage previously stored in the first capacitor C1, so that the output corresponds to the second power source VSS connected to the second electrode of the second switching device SW2, i.e., has the low level. As a result, the output in the first period T1 is maintained in the second period T2.

In a third period T3, the first clock signal CLK1 has a low level; the second clock signal CLK2 has a high level; and the initial input signal has a low level.

In this case, the sixth switching device SW6 is turned on and the seventh switching device SW7 is turned off. Then, the voltage applied to the gate electrode of the eighth switching device SW8 is boosted up to be equal to the first power source VDD supplied from the first electrode of the sixth switching device SW6. Thus, when the gate voltage of the eighth switching device SW8 increases up to the first power source VDD, the voltage applied to the first electrode cannot decrease below the first power source VDD, so that the first power source VDD of the high level is output through the output terminal N4 of the conversion part, thereby turning off the fourth switching device SW4 having the gate electrode connected to the output terminal of the conversion part.

Further, the fifth switching device SW5 is turned on by the first clock signal CLK1, and thus the input signals having the low level are applied to the gate electrodes of the first and third switching devices SW1 and SW3, thereby turning on the first and third switching devices SW1 and SW3.

Then, the second capacitor C2 is charged with a voltage to turn on the first switching device SW1 during the third period T3, i.e., a voltage corresponding to turning on the switching device SW1.

Thus, when the first and second switching devices SW1 and SW3 are turned on, the first power source VDD having the high level is applied to the output terminal and the gate electrode of the second switching device SW2.

On the other hand, the second switching device SW2 is turned off, so that the first capacitor C1 is charged with a voltage to turn off the second switching device SW2 during the third period T3, i.e., a voltage corresponding to turning off the second switching device SW2, thereby outputting the first power source VDD of the high level.

In a fourth period T4, the first clock signal CLK1 has a high level; the second clock signal CLK2 has a low level; and the initial input signal has a high level.

In this case, the sixth switching device SW6 is turned off and the seventh switching device SW7 is turned on. Therefore, the second clock signal CLK2 having the low level is input to the gate electrode of the eighth switching device SW8, so that the eighth switching device SW8 is turned on, thereby outputting the first clock signal CLK1 having the high level through the output terminal N4 of the conversion part.

Thus, the fourth switching transistor SW4 having the gate electrode connected to the output terminal of the conversion part is turned off.

Further, the fifth switching device SW5 is turned off by the first clock signal CLK1, and the first and third switching devices SW1 and SW3 are turned on by the voltage previously stored in the second capacitor C2, i.e., the voltage previously stored during the third period T3 and turning on the first switching device SW1.

As the fourth switching device SW4 is turned off, the second switching device SW2 is turned off by the voltage previously stored in the first capacitor C1 and turning off the second switching device SW2, thereby outputting the first power source VDD of the high level through the output terminal. As a result, the output in the third period T3 is maintained in the fourth period T4.

Meanwhile, the foregoing first through fourth periods T1 through T4 are repeated in sequence, thereby obtaining output waveforms as shown in FIGS. 3A-3G.

In each period, each stage of the shift register circuit shown in FIG. 1 is operated so that the output signal has a level inverted with respect to the input signal IN when the first clock signal CLK1 has the low level, but the level of the output signal in the previous period is maintained when the first clock signal CLK1 has the high level.

The remaining stages SRU2 through SRU(n) are constructed the same as the stage SRU1 shown in FIG. 2, however the connections of stages SRU2 through SRU(n) differ from the connections of stage SRU1 in the following respects. Each stage SRU2 through SRU(n) receives an output of a previous stage as an input at the first input terminal T1 and the gate of switching device SW6 instead of the input signal IN. Odd numbered stages 3, 5, 7, etc., receive the first clock signal CLK1 and the second clock signal CLK2 as shown in FIG. 2 and even numbered stages, 2, 4, 6, etc., receive the second clock signal CLK2 where the first clock signal CLK1 is shown in FIG. 2 and receive the first clock signal CLK1 where the second clock signal CLK2 is shown in FIG. 2.

Figure 4A:
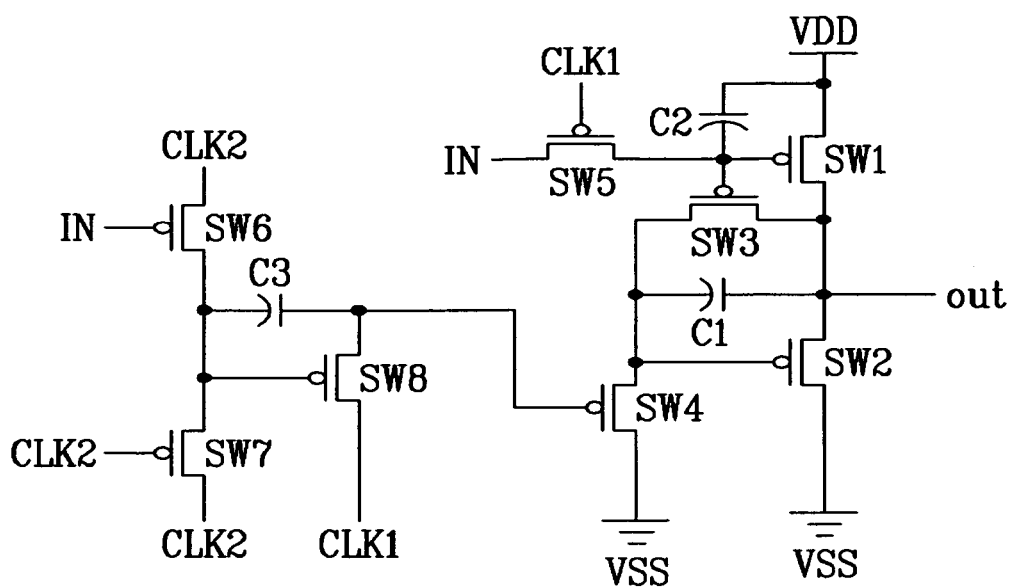
FIGS. 4A and 4B are circuit diagrams of stages of the shift register circuit of FIG. 1 according to second and third embodiments of the present invention.
Figure 4B:
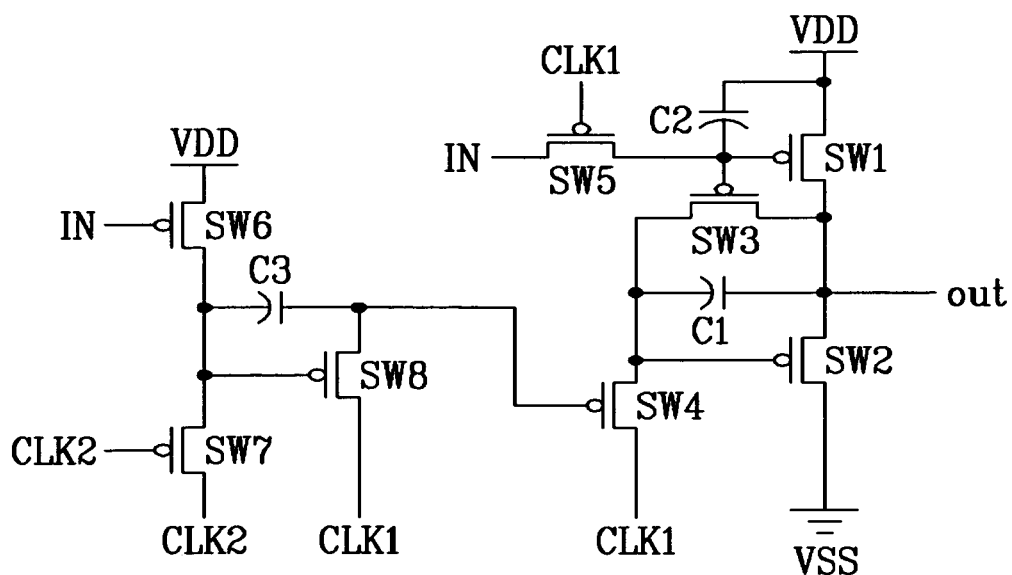

FIGS. 4A and 4B are circuit diagrams of stages SRU1 through SRU(n) according to second and third embodiments of the present invention, respectively, in the shift register circuit of FIG. 1. Here, like elements having like numerals as elements shown in the stage of FIG. 2 have a same function the elements shown in FIG. 2, and repetitive descriptions will be avoided.

In the shift register circuit according to the first embodiment shown in FIG. 2, the sixth and seventh switching devices SW6 and SW7 may be turned on at the same time, so that power consumption increases.

In the state that the sixth and seventh switching devices SW6 and SW7 are turned on at the same time, the first clock signal has the high level, so that the fourth switching device SW4 is turned off, thereby having no effect on the final output.

The embodiments illustrated in FIGS. 4A and 4B are provided for further reducing the power consumption of the shift register circuit shown in FIG. 1. The embodiments shown in FIGS. 4A and 4B have the same configuration as the first embodiment and differ in an arrangement of inputs to the circuit of each stage.

According to the second embodiment as shown in FIG. 4A, a source electrode of the eighth switching device SW6 is connected to the second clock signal CLK2 rather than to the first power source VDD as in the first embodiment shown in FIG. 2. According to the third embodiment as shown in FIG. 4B, a drain electrode of the fourth switching device SW4 is connected to the first clock signal CLK1 rather than the second power source VSS as in the first embodiment shown in FIG. 2.

Referring to FIG. 4A and FIG. 2, the operation of the second embodiment is as follows.

In the first period T1, the sixth switching device SW6 is turned off by the input voltage IN having a high level.

In the second period T2, the sixth switching device SW6 is turned on by the input voltage IN having a low level. Further, the seventh switching device SW7 is turned on by the second clock signal CLK2 having a low level supplied to a gate electrode of the seventh switching device SW7 in the second period T2. Then, the sixth and seventh switching devices SW6 and SW7 are turned on, so that a low level voltage is applied to the gate electrode of the eighth switching device SW8. In this case, the eighth switching device SW8 is turned on, so that a high level voltage is applied to the output terminal N4 of the conversion part.

According to the second embodiment, even though the sixth and seventh switching devices SW6 and SW7 are turned on at the same time in the second period T2, the sixth switching device SW6 receives the second clock signal CLK2 through the first electrode of the switching device SW6, thereby decreasing the power consumption. Comparatively, when the sixth and seventh switching devices SW6 and SW7 according to the first embodiment are turned on at the same time, the first power source VDD input to the first electrode of the sixth switching device SW6 and the second clock signal CLK2 input to the first electrode of the seventh switching device SW7 are connected, so that power consumption is relatively high. On the other hand, according to the second embodiment, since the first electrode of the sixth switching device SW6 receives the second clock signal CLK2, the power consumption is relatively low.

In the third period T3, the sixth switching device SW6 is turned on by the input voltage IN having the low level. As the sixth switching device SW6 is turned on, the high level voltage is applied to the gate electrode of the eighth switching device SW8. Then, the voltage applied to the first electrode of the eighth switching device SW8 is not dropped to less than the high level, so that the fourth switching device SW4 is turned off.

In the fourth period T4, the sixth switching device SW6 is turned off by the input voltage having the high level.

As described above, the circuit diagram according to the second embodiment of the present invention has a same structure as the circuit diagram of the first embodiment shown in FIG. 2. However, in operation, the circuit according to the second embodiment of the present invention has advantages that the power consumption is relatively low even though the sixth and seventh switching devices SW6 and SW7 are turned on at the same time.

Referring now to FIG. 4B and FIG. 2, the operation of the third embodiment is as follows.

In the first period T1, the fourth switching device SW4 is turned on by an input voltage having a low level and supplied from the output terminal N4 of the conversion part. At this time, the first clock signal CLK1 having the low level is applied to the first electrode of the fourth switching device SW4. In this case, the low level voltage is applied to the gate electrode of the second switching device SW2, so that the second switching device SW2 is turned on. In the second period T2, the third period T3 and the fourth period T4, the conversion part supplies the high level voltage, so that the fourth switching device SW4 is turned off.

That is, the shift register circuit according to the third embodiment of the present invention is operated like that of the first embodiment shown in FIG. 2. Here, the shift register circuit according to the third embodiment employs the odd numbered stages to sequentially shift the signals having an inverted level, i.e., having the opposite polarity to the initial input signal and outputs the shifted signals P1, P2, . . . , Pn; and employs the even numbered stages to sequentially shift the signals having the same phase with the initial input signal and outputs the shifted signals S1, S2, . . . , Sn. Thus, in the case where the shift register circuit according to the third embodiment is used as a typical shift register circuit, the output lines of the odd numbered stages can be removed so as to select only the signals S1, S2, . . . , Sn output through the even numbered stages.

The stage circuits shown in FIGS. 2, 4A and 4B may be viewed as a circuit having first through eleventh interface points and connectable in a variety of ways to achieve a same result in an operating shift register circuit. Various combinations of connections of the stage circuit are summarized in FIG. 5. In FIG. 5, IN1 represents an initial input or an output of a previous even numbered stage and IN2 represents an output of a previous odd numbered stage.

The embodiments of the present invention provide a shift register circuit, which can improve a production yield thereof and decrease a production cost and a power consumption thereof.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A shift register circuit comprising n stages SRU1 through SRUn dependently connected to an initial input signal or a previous output signal and connected to first and second clock signals, each stage comprising:
a first switching device connected between a first power source and an output terminal;
a second switching device connected between the output terminal and a second power source;
a third switching device connected between a first node and the output terminal and having a gate electrode connected to the gate electrode of the first switching device;
a fourth switching device connected between the first node and the second power source and having a gate electrode connected to an output terminal of a conversion part;
a fifth switching device connected between a first input terminal and the gate electrode of the first switching device;
a first capacitor connected between the output terminal and the first node; and
a second capacitor connected between the first power source and the gate electrode of the first switching device.

2. The shift register circuit according to claim 1, wherein the first through fifth switching devices through are implemented by PMOS transistors.

3. The shift register circuit according to claim 1, wherein the fifth switching device receives the initial input signal or the previous output signal through the first input terminal connected to the first electrode thereof, and receives the first clock signal through the gate electrode thereof.

4. The shift register circuit according to claim 1, wherein the first capacitor connected between the output terminal and the first node is connected between the first electrode and the gate electrode of the second switching device, and is charged with a voltage corresponding to turning on or off the second switching device.

5. The shift register circuit according to claim 1, wherein the second capacitor connected between the first power source and the gate electrode of the first switching device is connected between the first electrode and the gate electrode of the first switching device, and is charged with a voltage corresponding to turning on or off the first switching device.

6. The shift register circuit according to claim 1, wherein the conversion part comprises:
  a sixth switching device connected between the first power source and a third node 3;
  a seventh switching device connected between the third node and a second input terminal;
  an eighth switching device connected between an output terminal of the conversion part and a third input terminal and having a gate electrode connected to the third node; and
  a third capacitor connected between the third node and the output terminal of the conversion part.

7. The shift register circuit according to claim 6, wherein the sixth through eighth switching devices through are implemented by transistors.

8. The shift register circuit according to claim 6, wherein the third capacitor connected between the third node and the output terminal of the conversion part is connected between the first electrode and the gate electrode of the eighth switching device and is charged with a voltage corresponding to turning on or off the eighth switching device.

9. The shift register circuit according to claim 6, wherein the sixth switching device receives the initial input signal or the previous output signal through the gate electrode thereof, and the seventh switching device receives the second clock signal through the gate electrode thereof.

10. The shift register circuit according to claim 6, wherein the second clock signal is input to the second input terminal, and the first clock signal is input to the third input terminal.

11. The shift register circuit according to claim 1, wherein each stage comprises a first clock terminal and a second clock terminal to receive first and second clock signals and of which phases are inverted with respect to each other, respectively.

12. The shift register circuit according to claim 11, wherein odd numbered stages receive the first clock signal through the first clock terminal and the second clock signal through the second clock terminal, and even numbered stages receive the second clock signal through the first clock terminal and the first clock signal through the second clock terminal.

13. The shift register circuit according to claim 12, wherein the odd numbered stages sequentially shift signals having an inverted phase with respect to the initial input signal and output shifted signals P1, P2, . . . , Pn; and the even numbered stages sequentially shift the signals having the same phase with the initial input signal IN and output shifted signals S1, S2, . . . , Sn.

14. The shift register circuit according to claim 1, wherein each stage outputs a signal having an inverted level to the initial input signal when the first clock signal has a low level and the second clock signal has a high level, and maintains the output of a previous period when the first clock signal has a high level and the second clock signal has a low level.

15. A shift register stage circuit comprising:
  first through eighth switching devices, each having a gate electrode, a first electrode and a second electrode;
  first through third capacitors, each having a first terminal and a second terminal; and
  first through eleventh interface points; wherein:
    the first and second electrodes of the first switching device are connected to the first and second interface points, respectively, the second interface point being an output of the shift register stage circuit;
    the first and second terminals of the second capacitor are connected to the first and gate electrodes of the first switching device, respectively;
    the first and second electrodes of the second switching device are connected to the second and third interface points, respectively;
    the first and second electrodes of the third switching device are connected to the gate of the second switching device and the second interface point, respectively;
    the first and second terminals of the first capacitor are connected to the gate of the second switching device and the second interface point, respectively;
    the first and second electrodes of the fourth switching device are connected to the gate of the second switching device and the fourth interface point, respectively;
    the gate electrode and the first and second electrodes of the fifth switching device are connected to the eleventh interface point, the tenth interface point, and the gate of the first switching device, respectively;
    the gate electrode and the first electrode of the sixth switching device are connected to the eighth and ninth interface points, respectively;
    the gate electrode and the first and second electrodes of the seventh switching device are connected to the seventh interface point, the second electrode of the sixth switching device and the sixth interface point, respectively;
    the gate electrode and the first and second electrodes of the eighth switching device are connected to the first electrode of the seventh switching device, the gate electrode of the fourth switching device and the fifth interface point, respectively; and
    the first and second terminals of the third capacitor are connected to the first and gate electrodes of the eighth switching device, respectively.

16. The shift register stage circuit of claim 15, wherein, where the stage circuit is included as an odd numbered stage circuit in a shift register circuit comprising stages 1 through n:
  the eighth and tenth interface points are connected to an input signal to be shifted or to the output of a previous even numbered stage,
  the first and ninth interface points are connected to a first power supply,
  the third and fourth interface points are connected to a second power supply,
  the fifth and eleventh interface points are connected to a first clock signal, and
  the sixth and seventh interface points are connected to a second clock signal having an opposite phase with the first clock signal.

17. The shift register stage circuit of claim 16, wherein, where the stage circuit is included as an even numbered stage circuit in a shift register circuit comprising the stages 1 through n:

the eighth and tenth interface points are connected to the output of a previous odd numbered stage, the first and ninth interface points are connected to a first power supply, the third and fourth interface points are connected to a second power supply, the fifth and eleventh interface points are connected to the second clock signal, and the sixth and seventh interface points are connected to the first clock signal.

18. The shift register stage circuit of claim 15, wherein, where the stage circuit is included as an odd numbered stage circuit in a shift register circuit comprising stages 1 through n:

the eighth and tenth interface points are connected to an input signal to be shifted or to the output of a previous even numbered stage, the first interface point is connected to a first power supply, the third and fourth interface points are connected to a second power supply, the fifth and eleventh interface points are connected to a first clock signal, and the sixth, seventh and ninth interface points are connected to a second clock signal having an opposite phase with the first clock signal.

19. The shift register stage circuit of claim 18, wherein, where the stage circuit is included as an even numbered stage circuit in a shift register circuit comprising stages 1 through n:

the eighth and tenth interface points are connected to the output of a previous odd numbered stage circuit, the first interface point is connected to a first power supply, the third and fourth interface points are connected to a second power supply, the fifth and eleventh interface points are connected to the second clock signal, and the sixth, seventh and ninth interface points are connected to the first clock signal.

20. The shift register stage circuit of claim 15, wherein, where the stage circuit is included as an odd numbered stage circuit in a shift register circuit comprising stages 1 through n:

the eighth and tenth interface points are connected to an input signal to be shifted or to the output of a previous even numbered stage circuit, the first and ninth interface points are connected to a first power supply, the third interface points is connected to a second power supply, the fourth, fifth and eleventh interface points are connected to a first clock signal, and the sixth and seventh interface points are connected to a second clock signal having an opposite phase with the first clock signal.

21. The shift register stage circuit of claim 20, wherein, where the stage circuit is included as an even numbered stage circuit in a shift register circuit comprising stages 1 through n:

the eighth and tenth interface points are connected to the output of a previous odd numbered stage, the first and ninth interface points are connected to a first power supply, the third interface point is connected to a second power supply, the fifth, sixth and eleventh interface points are connected to the second clock signal, and the sixth and seventh interface points are connected to the first clock signal.

* * * * *